US008854041B2

(12) United States Patent
Wheaton et al.

(10) Patent No.: US 8,854,041 B2
(45) Date of Patent: Oct. 7, 2014

(54) SPATIALLY SHAPED PRE-SATURATION PROFILE FOR ENHANCED NON-CONTRAST MRA

(75) Inventors: Andrew J. Wheaton, Shaker Heights, OH (US); Wayne R. Dannels, Mentor, OH (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 363 days.

(21) Appl. No.: 13/112,349

(22) Filed: May 20, 2011

(65) Prior Publication Data
US 2012/0293172 A1 Nov. 22, 2012

(51) Int. Cl.
*G01V 3/00* (2006.01)

(52) U.S. Cl.
USPC ........................................... 324/318; 324/322

(58) Field of Classification Search
USPC ........................... 324/300–322; 600/407–445
See application file for complete search history.

(56) References Cited

U.S. PATENT DOCUMENTS

| 6,814,280 | B2* | 11/2004 | Miyoshi et al. | 324/319 |
| 6,845,260 | B2* | 1/2005 | Liu et al. | 600/410 |
| 6,889,072 | B2* | 5/2005 | Prince | 600/420 |
| 7,020,314 | B1* | 3/2006 | Suri et al. | 382/130 |
| 7,680,527 | B2* | 3/2010 | Prince | 600/420 |
| 8,154,287 | B2* | 4/2012 | Edelman et al. | 324/309 |
| 8,332,010 | B2* | 12/2012 | Edelman | 600/410 |
| 8,401,258 | B2* | 3/2013 | Hargrove et al. | 382/128 |
| 2003/0160611 | A1 | 8/2003 | Miyoshi et al. | |
| 2003/0166999 | A1* | 9/2003 | Liu et al. | 600/410 |
| 2010/0134103 | A1* | 6/2010 | Edelman et al. | 324/309 |
| 2010/0201361 | A1* | 8/2010 | Edelman | 324/309 |
| 2010/0226556 | A1* | 9/2010 | Kumai et al. | 382/131 |
| 2010/0268062 | A1 | 10/2010 | Edelman | |
| 2013/0317348 | A1* | 11/2013 | Miyazaki | 600/419 |

FOREIGN PATENT DOCUMENTS

CN      1441258 A       9/2003
WO   2009/015348 A1    1/2009

OTHER PUBLICATIONS

Extended European search report in EP 12168563.0-2216 dated Aug. 14, 2012.
Tetsuya Matsuda et al., "An Asymmetric Slice Profile: Spatial Alteration of Flow Signal Response in 3D Time-of-Flight NMR Angiography," Magnetic Resonance in Medicine, Academic Press, Duluth, MN, US, vol. 29, No. 6, Jun. 1, 1993, pp. 783-789, XP00036962, ISSN: 0740-3194.

(Continued)

Primary Examiner — Brij Shrivastav
(74) Attorney, Agent, or Firm — Nixon & Vanderhye PC

(57) ABSTRACT

A magnetic resonance imaging (MRI) system is used to produce an image representative of the vasculature of a subject by applying a non-contrast MRI pulse sequence to acquire MRI k-space data from non-stationary nuclei flowing in a selected spatial region of a subject after nuclei within the region have been subjected to spatially non-uniform pre-saturation of nuclear magnetic resonance (NMR) magnetization. Such pre-saturation suppresses subsequent MRI signals emanating from background nuclei located within said region during said pre-saturation, while enhancing MRI signal from flowing nuclei therewithin as a function of speed, slice thickness and elapsed time until image capture as a function of the spatially shaped profile of non-uniform pre-saturation across the imaged volume. Thus, acquired MRI k-space data can then be used to reconstruct an image representing vasculature of the subject.

19 Claims, 7 Drawing Sheets

(56) References Cited

OTHER PUBLICATIONS

Edelman R.R. et al., "Quantification of Blood Flow with Dynamic MR Imaging and Presaturation Bolus Tracking," Radiology, Radiological Society of North America, Oak Brook, IL, US; vol. 171, Jan. 1, 1989, pp. 551-556, XP002481393, ISSN: 0033-8419.

Tyszka M. et al., "Automatic Analysis of Tagged Images of Laminar Fluid Flow," Journal of Magnetic Resonance, Academic Press, Orlando, FL, US, vol. 97, No. 2, Apr. 1, 1992, pp. 391-397, XP000275064, ISSN: 1090-7807.

Yu Liu et al., "Magnetization-Prepared Cardiac Imaging Using Gradient Echo Acquisition," Magnetic Resonance in Medicine, Academic Press, Duluth, MN, US, vol. 30, No. 2, Aug. 1, 1993, pp. 271-275, XP000385362, ISSN: 0740-3194.

K.J. Jung et al., "Artifacts due to Reverse Flow in the Artery and Their Correction in TOF Angiography with Presaturation of the Vein," Proc. Intl. Soc. Mag. Reson. Med., Jan. 1, 2000, p. 1826, XP55034598.

Nägele, et al., "The Effects of Linearly Increasing Flip Angles on 3D Inflow MR Angiography," *Mag. Res. Med.*, vol. 31, pp. 561-566 (1994).

Priatna, et al., "Variable-Angle Uniform Signal Excitation (VUSE) for Three-Dimensional Time-of-Flight MR Angiography," *J. Med. Res. Imaging*, vol. 5, No. 4, pp. 421-427 (1995).

Purdy, et al. "The Design of Variable Tip Angle Slab Selection (TONE) Pulses for Improved 3-D MR Angiography," Proceedings of the Annual Scientific Meeting and Exhibition of the International Society for Magnetic Resonance in Medicine, Berlin, Germany, p. 882 (1992).

Edelman, et al., "Quiescent-Interval Single-Shot Unenhanced Magnetic Resonance Angiography of Peripheral Vascular Disease: Technical Considerations and Clinical Feasibility," *Mag. Res. Med.*, vol. 63, pp. 951-958 (2010).

Edelman, et al., "Quiescent Interval Single Shot MR Angiography," Proceedings of the Annual Scientific Meeting and Exhibition of the International Society for Magnetic Resonance in Medicine, Stockholm, Sweden, p. 1384 (2010).

Glielmi, et al., "Navigator-Gated Quiescent Interval Single Shot for Pelvic MR Angiography," Proceedings of the Annual Scientific Meeting and Exhibition of the International Society for Magnetic Resonance in Medicine, Stockholm, Sweden, p. 1398 (2010).

Offerman, et al., "Unenhanced Techniques for Peripheral MRA: Phantom Evaluation in the Setting of Triphasic Flow and Stenosis," Proceedings of the Annual Scientific Meeting and Exhibition of the International Society for Magnetic Resonance in Medicine, Stockholm, Sweden, p. 1413 (2010).

Hodnett, et al., "Combined Renal and Peripheral MRA with a New Technique at 3.0 T," Proceedings of the Annual Scientific Meeting and Exhibition of the International Society for Magnetic Resonance in Medicine, Stockholm, Sweden, p. 1408 (2010).

Hodnett, et al., "Clinical Evaluation of Peripheral Vascular Disease Using a Hybrid Approach: Unenhanced Quiescent Interval Single Shot and Low-Dose Twist MR Angiography," Proceedings of the Annual Scientific Meeting and Exhibition of the International Society for Magnetic Resonance in Medicine, Stockholm, Sweden, p. 1408 (2010).

Office Action dated Feb. 18, 2014 in CN 201210156540.X.

\* cited by examiner

TYPICAL QISS SSFP SINGLE SHOT MRI SEQUENCE

SPATIALLY SHAPED PRE-SATURATION PROFILE FOR ENHANCED NON-CONTRAST MRA

FIELD

The subject matter below relates generally to magnetic resonance imaging (MRI) processes utilizing nuclear magnetic resonance (NMR) effects. Preferably, the MRI processes described below involve enhancements to non-contrast magnetic resonance (MR) imaging of patient vasculature such as MR angiography (MRA) and/or MR venography (MRV).

DETAILED DESCRIPTION

Figure 1:
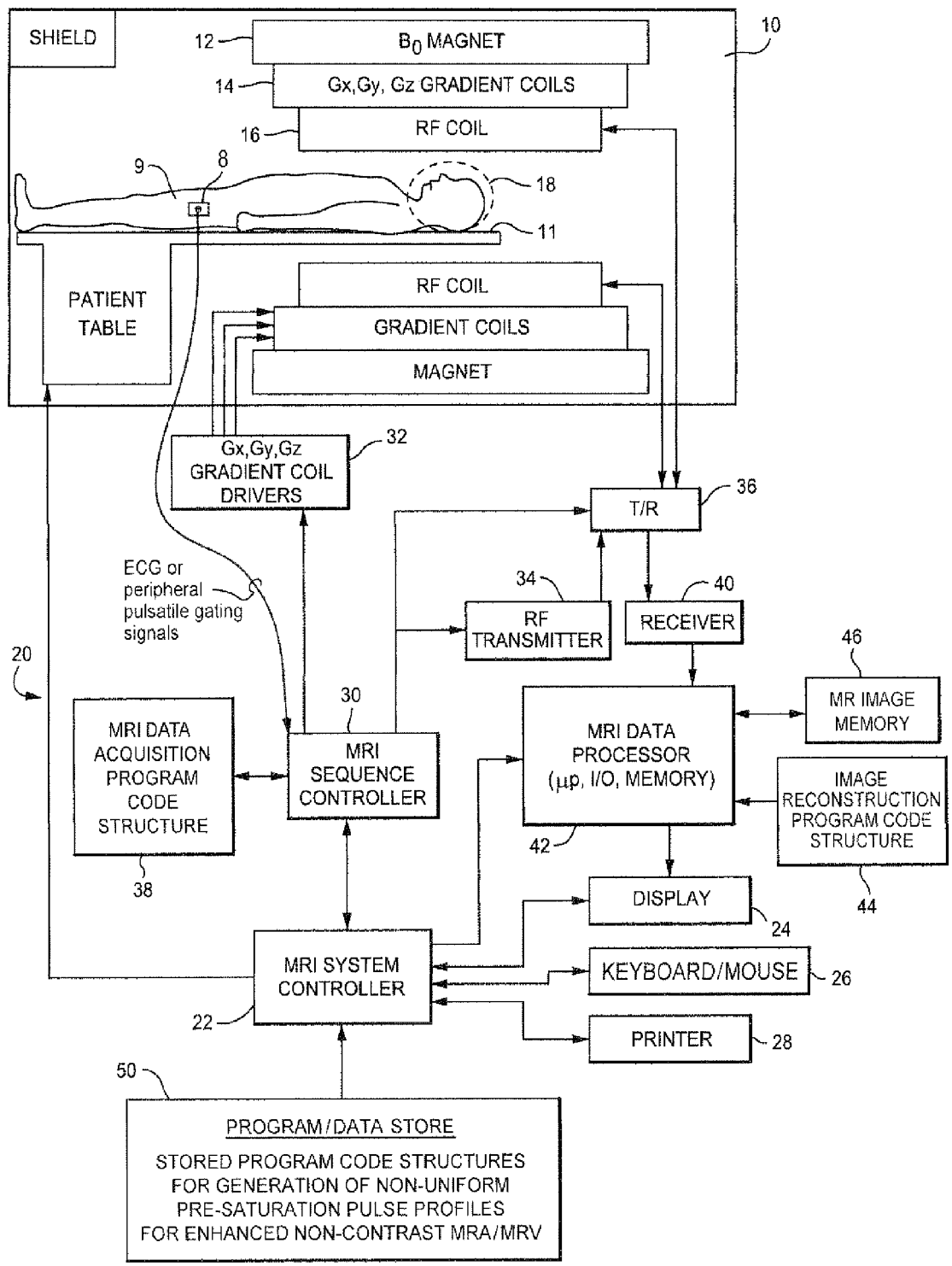
FIG. 1 is a high-level schematic block diagram of an exemplary MRI system embodiment adapted to acquire and process data for enhanced non-contrast MRA and/or MRV imaging of NMR nuclei in-flowing to a selected spatial region that has previously been subjected to spatially non-uniform degrees of saturation within that region.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$ and $G_z$ gradient coil set 14 and an RF coil assembly 16. Along the horizontal axis of this cylindrical array of elements is an imaging volume 18 shown as substantially encompassing the head of a patient 9 supported by a patient bed or table 11. As will be understood, various RF coil structures and/or coil arrays may be used for transmitting and/or receiving RF signals to/from the imaging volume 18.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). As those in the art will appreciate, one or more suitable physiological transducers 8 may be affixed to the patient's body to provide ECG (electrocardiogram) and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30—e.g., to generate non-contrast MRA (magnetic resonance angiography) and/or MRV (magnetic resonance venography) images using operator and/or system inputs defining particular MRI data acquisition sequence parameters.

The MRI system 20 includes an RF receiver 40 providing input to data processor 42 so as to create processed image data to display 24. The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for generation of non-uniform pre-saturation pulse profiles for enhanced non-contrast MRA and/or MRV images, for accepting operator inputs to control same, etc.) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR-imaging reconstruction process, an array of computer-readable accessible data value storage sites (e.g., multi-digit binary representations of pixel values) in physical storage media will be transformed from some prior state (e.g., all uniform "zero"

values or all "one" values) to a new state wherein the physical states at the physical sites of such an array (e.g., of pixel values) vary between minimum and maximum values to represent real world physical events and conditions (e.g., the tissues of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

A general class of non-contrast MRA techniques generate white blood angiography images by saturating background tissue in an intended image slice region and thereafter allowing "fresh" (i.e., unsaturated) in-flowing blood to appear bright in a subsequently acquired MR image of the image slice region. Time-of-Flight (TOF) MRI is one example of such a technique.

Figure 2:
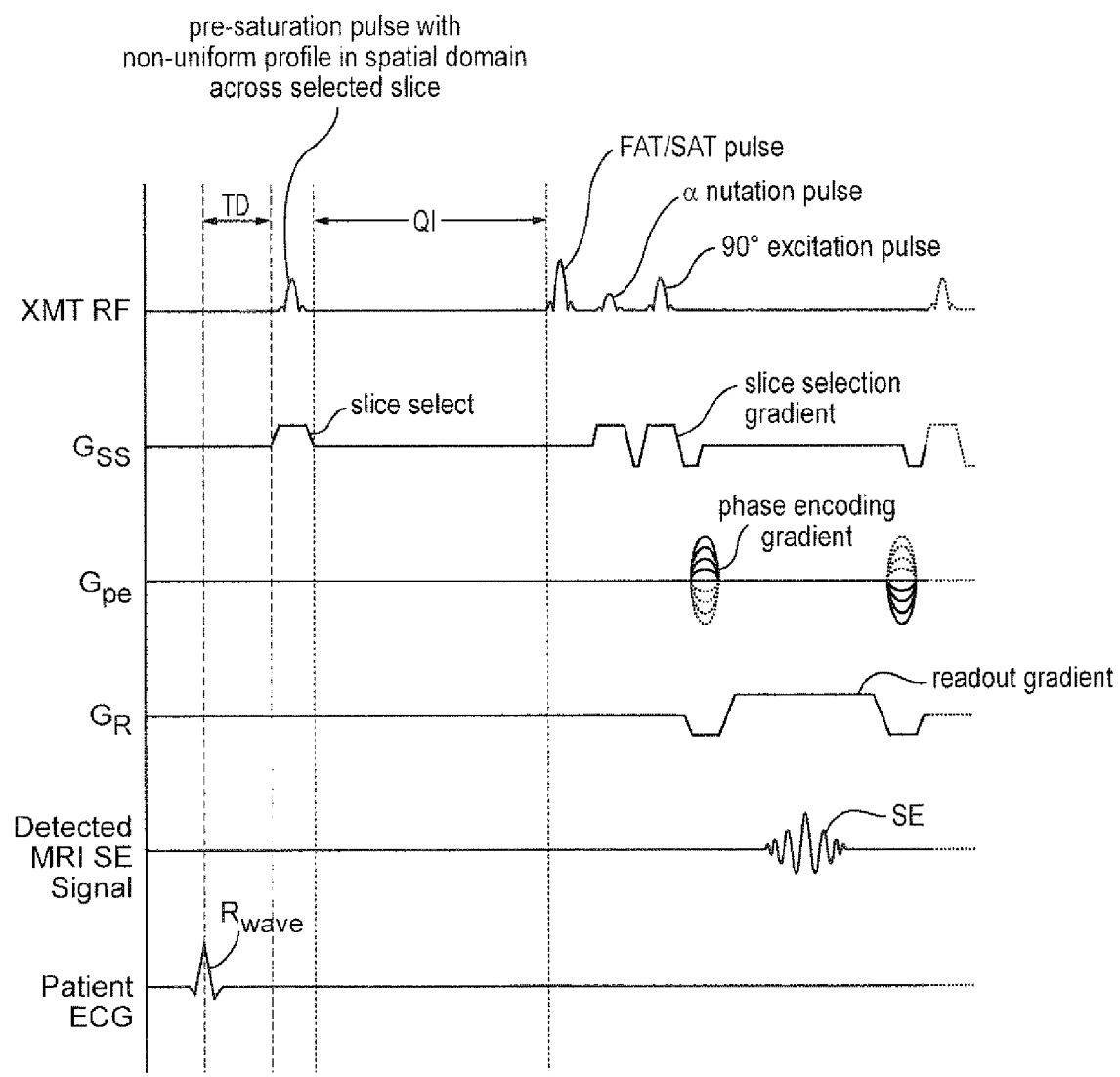
FIG. 2 is a schematic representation of a typical non-contrast QISS (quiescent interval single shot) MRI sequence using a modified pre-saturation pulse having a non-uniform profile in the spatial domain across the selected image slice.

A variant of TOF, called Quiescent Interval Single Shot (QISS) is depicted schematically in FIG. 2. QISS applies a spatially selective pre-saturation pulse directly on the image slice of interest. The effect of the on-slice saturation is to immediately generate background suppression in the slice of interest. During a "quiescent interval" (QI) fresh non-saturated blood is allowed to flow into the slice of interest. The QI typically is chosen to be approximately 200-300 ms, i.e., long enough to allow sufficient in-flow of fresh blood, but short enough to prevent substantial T1 NMR recovery of the previously saturated background tissue. After the QI, the magnetization of fresh in-flow blood is detected using conventional MRI pulse sequence(s), e.g., a 2D readout such as SSFP (steady-state free precession). To save scan time, the readout is typically performed in a "single shot". As will be appreciated, during each "single shot," one or more different magnitudes of phase encoding are employed so as to acquire data during that shot for a corresponding part of k-space. To make the scan into an arteriogram, venous blood can be saturated using a separate "walking" (i.e., sequentially moved) spatially selective pre-saturation pulse, as is commonly applied in TOF2D.

The on-slice spatially selective pre-saturation is effective at reducing background tissue signal. However, it also saturates blood then disposed within the slice of interest. For blood flow with relatively slow velocity, such as the blood near the edges of a vessel with laminar flow or blood in small arterioles, the QI is typically not long enough to allow complete refreshment of blood within the slice during a typical MRI data acquisition pulse sequence. Some residual saturated slow-flowing blood may thus still be in the slice at the time of MRI data acquisition, thereby resulting in undesirable signal loss. This same problem gets worse with thicker slices and/or a shorter QI.

The consequences of this problem are numerous. First, and most importantly, the MRI signal emanating from small vessels may be severely diminished, often to the point where it is absent in the final image. The signal from the edges of larger vessels (with slow velocity in the case of laminar flow) is also decreased, thereby reducing their apparent lumen width and resulting in possible over-estimation of stenosis.

The second problem is that the QI often must be carefully chosen to allow sufficient in-flow while reducing background signal. If the quiescent interval is long relative to the T1 NMR relaxation time of background tissue, undesirable background signal can increase and reduce conspicuity of the vessels to be imaged. This problem is most prevalent for fat nuclei since QI is often on the order of fat T1 (e.g., ~250 ms).

Figure 3:
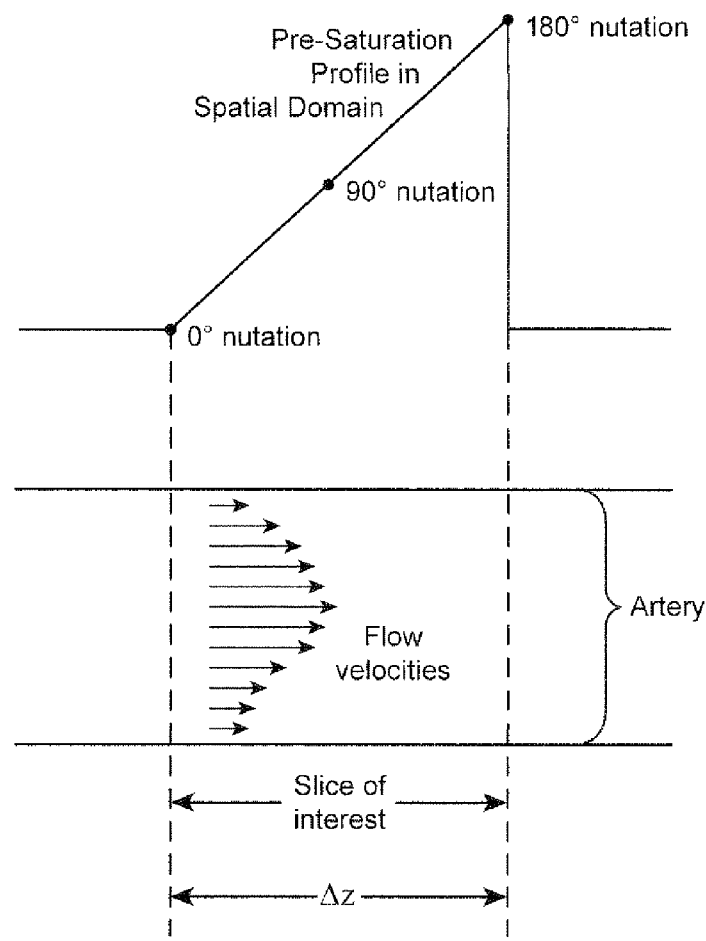
FIG. 3 schematically illustrates a pre-saturation pulse profile in the spatial domain having lesser saturation near the in-flow edge of the imaged slice and greater saturation near the out-flow edge of the imaged slice.

An exemplary embodiment described below modifies the spatial profile of the pre-saturation pulse in a non-contrast MRI (e.g., MRA and/or MRV) sequence to address at least some of the above-discussed disadvantages. The pre-saturation spatial profile of the pulse can be "shaped" to selectively saturate to a greater degree near an "out-flow edge" of the slice of interest and selectively saturate less near the "in-flow edge" of the slice as shown in FIG. 3. For example, the pre-saturation pulse can be designed to generate a ramped spatial profile, similar to a TONE (tilt optimized non-saturated excitation) pulse or other shaped spatial profile RF excitation pulses, with minimal flip angle near the in-flow edge and maximum flip angle near the out-flow edge. In general, the time domain envelope of a spatially selective RF NMR pulse is related to the spatial domain profile by a Fourier Transformation (FT). For example, a typical RF excitation pulse is given a sinc-shaped time domain envelope because, after Fourier Transformation, this becomes square wave in the spatial domain with a uniform spatial domain profile. Similarly, inverse Fourier Transformation ($FT^{-1}$) of the desired spatial domain profile can be used to define a corresponding time domain RF pulse envelope shape.

Flowing spins starting at the arterial in-flow edge of the $\Delta z$-thick image slice of interest (left hand side in FIG. 3) take the longest time to exit the slice (and be replaced by fresh in-flow magnetization). By using a spatially shaped pre-saturation pulse, these spins are only partially saturated (or possibly not at all). Thus, if they are slow and are still within the slice after QI at image capture time, they can still contribute signal to the final image. The spins near the out-flow edge of the slice are more strongly saturated during pre-saturation. However, they have less distance to travel to exit the slice, and thus they may never contribute to the final signal anyway, regardless of the status of their magnetization.

In any MRI application, the acquired image signal is effectively the integral of the signal across the dimensions of each voxel. Thus, in the slice dimension, the signal contribution of the background tissue is effectively the integral of complex magnetization following the pre-saturation pulse (e.g., including T1 relaxation effects during the QI if QISS is used). Therefore, a spatially shaped pre-saturation pulse can be designed in such a way that its spatial profile integrates to null signal while still applying a spatially shaped pre-saturation profile across the slice.

Figures 4A, 4B, 4C, 4D:
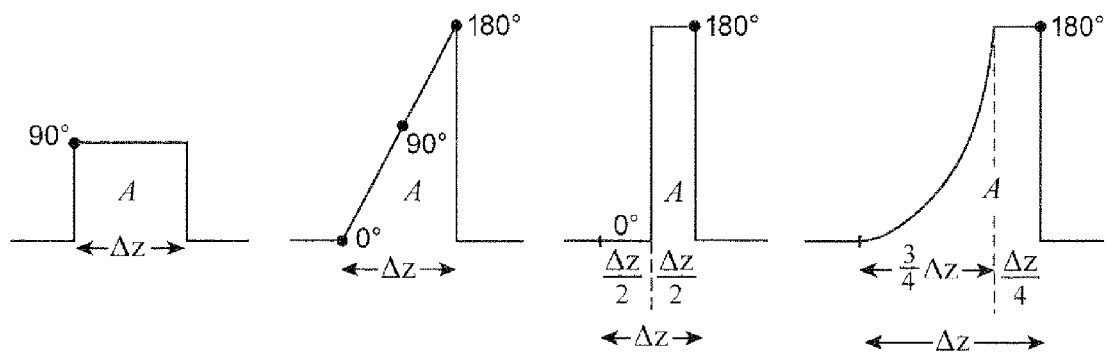
FIGS. 4A-4D schematically illustrate examples of a few possible pre-saturation profiles in the spatial domain across the slice to be imaged.

Based on these criteria, many spatially shaped non-uniform pre-saturation pulses can be designed—and some are depicted in FIGS. 4B-4D. Some examples of non-uniform shaping include a linear ramp (FIG. 4B) similar to a TONE RF excitation pulse, a parabolic shape (FIG. 4D) similar to a VUSE (variable angle uniform signal excitation) RF excitation pulse, or a simple half-slice-width rectangular selection (FIG. 4C). All of these pulse profiles have the same integrated area. The pulses themselves have been well understood for some time as RF excitation pulses (i.e., an initial NMR excitation part of an MRI data acquisition sequence). However, use of such spatially shaped profile RF pulses as spatially selective pre-saturation RF pulses (e.g., for the purpose of non-contrast in-flow MRA) has now been discovered as a new way to take advantage of their spatially non-uniform shaped selection profiles.

Here, "saturation" is used to confer signal suppression, especially of initial positive magnetization (Mz) in the subsequent image. The spatial pre-saturation pulse is not restricted to a 90° nutation. The spatial pre-saturation pulse will likely include spatial regions where the nutation exceeds 90°. When the effect of the saturation in spatial regions is greater than a 90° nutation, it is still described as saturation as opposed to using the term "inversion." Thus, when a spatial pre-pulse locally has a greater nutation angle, even if that angle exceeds 90°, in these exemplary embodiments, such is described as "greater saturation" compared to lesser RF nutation, even if that lesser nutation is closer to a 90° nutation. Such usage is common in MRI where spatial pulses, chemically selective pre-pulses or the like may often be utilized with nutation angles greater than 90° to accomplish saturation effects within a more complicated pulse sequence.

Figure 5A:
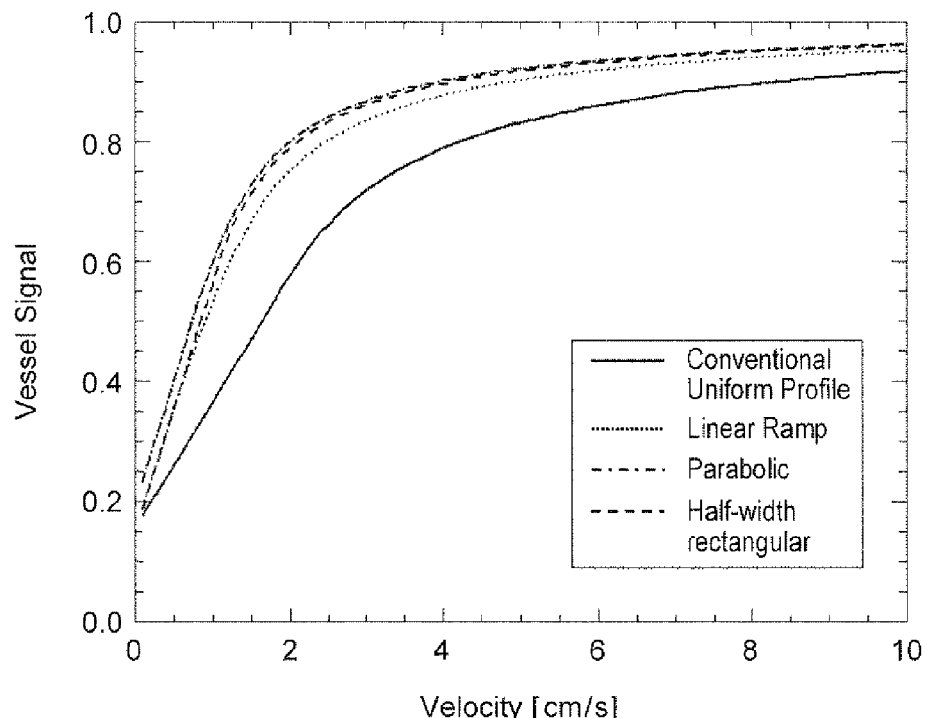
FIGS. 5A-5B depict simulated examples of vessel signal and relative signal improvement (as compared to a uniform conventional profile) for blood flow as a function of velocity using differently shaped pre-saturation profiles.
Figure 5B:
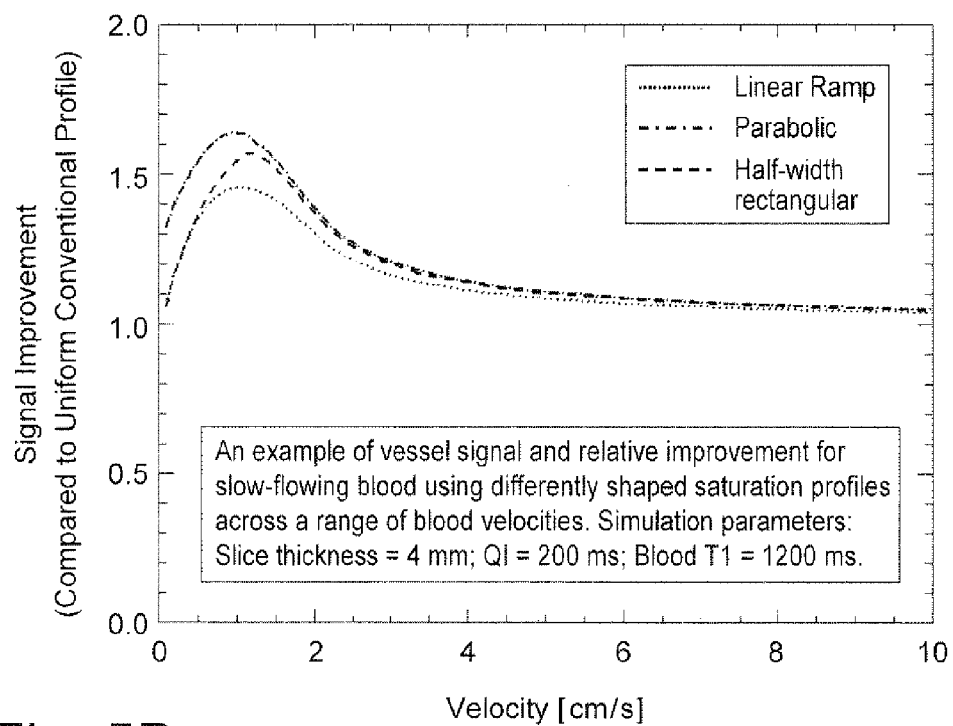

Based on simulations, the non-uniformly shaped pre-saturation pulse greatly increases MRI signal contribution from relatively slow velocity blood as shown in FIGS. 5A-5B. The simulated signal increase is generally between 20-60%, depending on blood velocity, QI and slice thickness. For fast velocity blood (e.g., peak velocity >10 cm/s), non-uniformly shaped pre-saturation profiles may offer no relative improvement as almost all of the blood has been refreshed during QI.

Figure 6A:
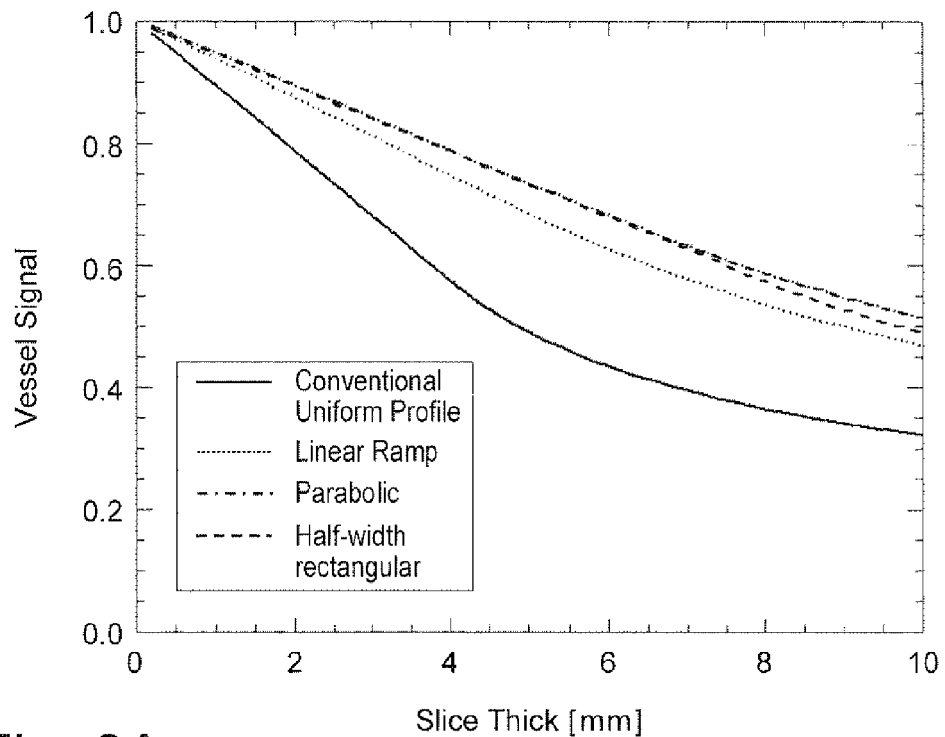
FIGS. 6A-6B depict simulated vessel signal and relative signal improvement (as compared to a uniform conventional profile) as a function of slice thickness for relatively slow-flowing blood.
Figure 6B:
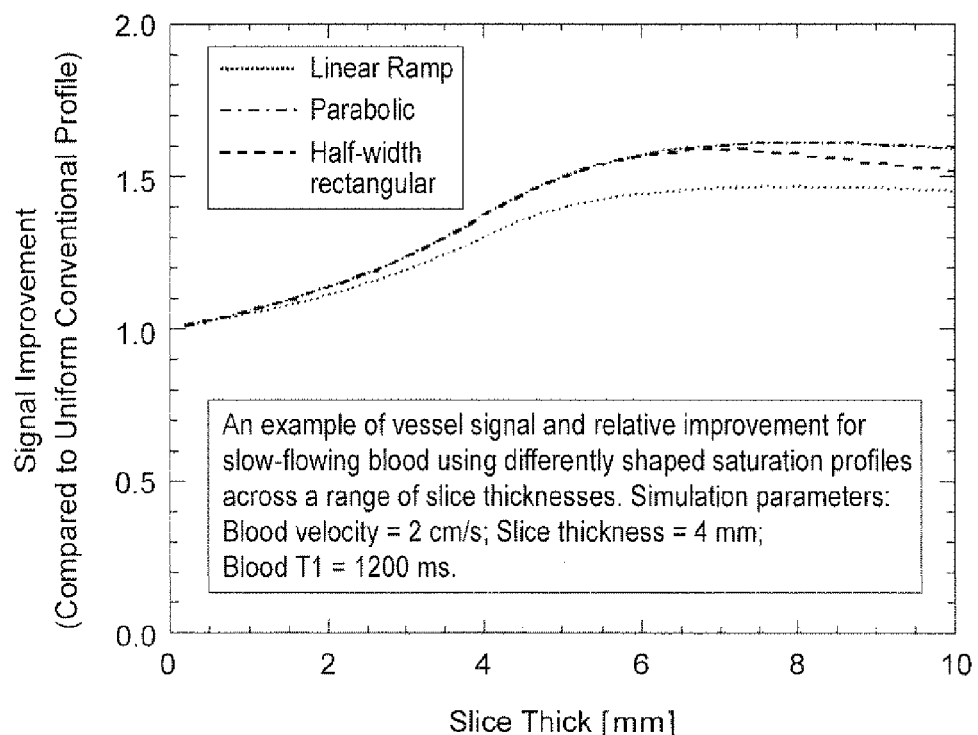
Figure 7A:
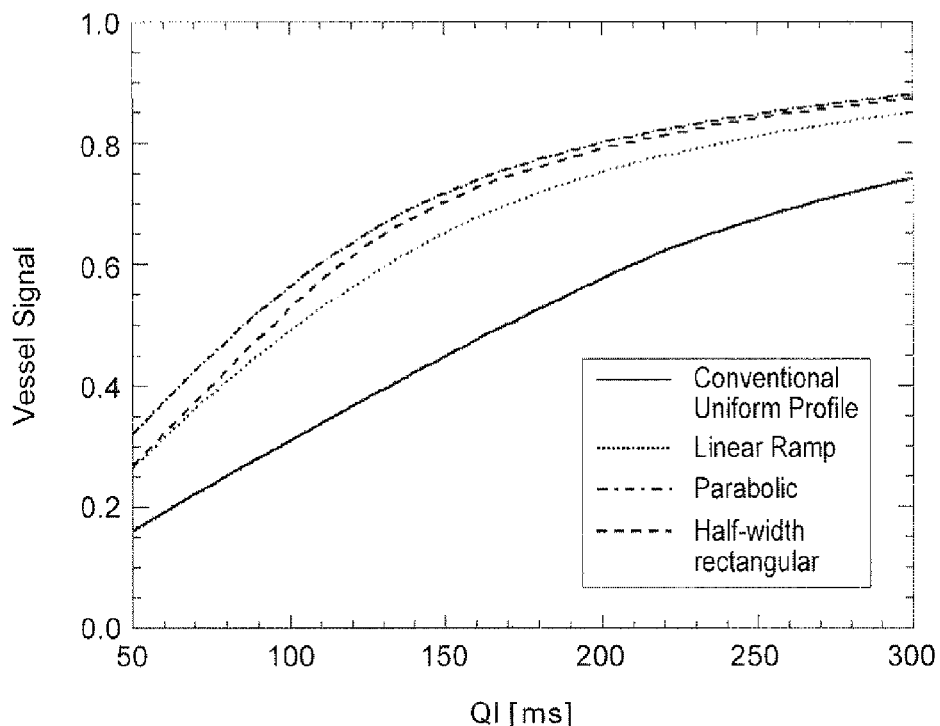
FIGS. 7A-7B depict simulated vessel signal and relative signal improvement (as compared to a uniform conventional profile) as a function of the quiescent interval in a QISS MRA sequence for relatively slow-flowing blood and differently shaped pre-saturation profiles.
Figure 7B:
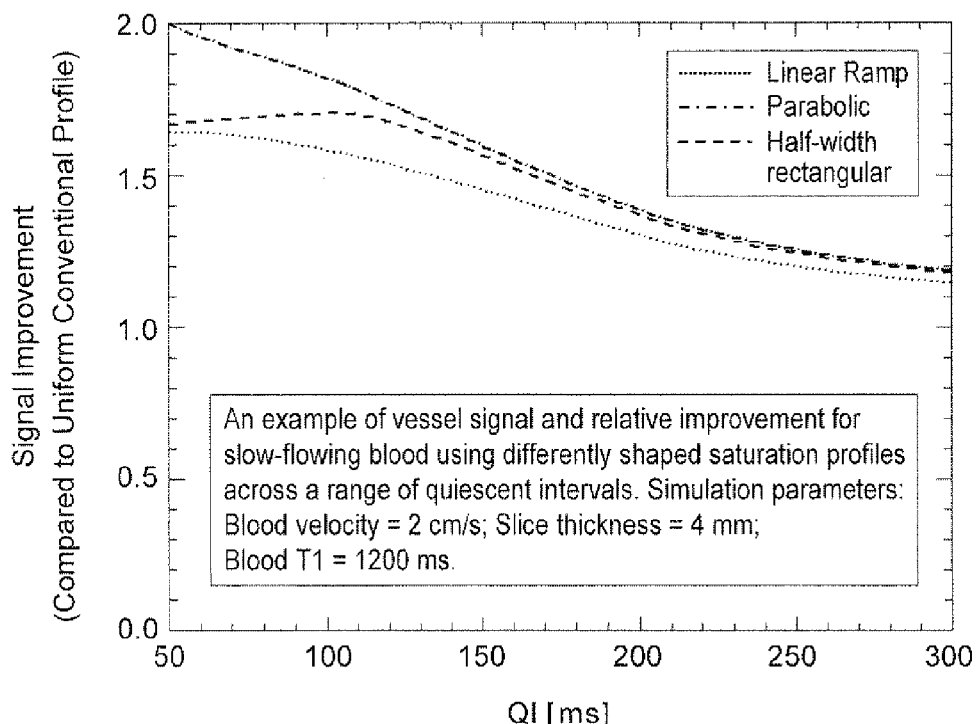

However, by using a non-uniformly shaped pre-saturation pulse, a QISS data acquisition scan (as depicted schematically in FIG. 2) can become less sensitive to the choice of critical parameters such as slice thickness and QI. With non-uniformly shaped pre-saturation pulses, the slice of interest may be thickened to increase SNR and/or save scan time as depicted in FIGS. 6A-6B. Likewise, non-uniformly shaped pre-saturation pulses relieve the burden of QI selection and also generate more robust signals, even for slow-flowing spins, across a wide range of QI as depicted in FIGS. 7A-7B.

The use of a non-uniformly shaped pre-saturation pulse can make the vessel signal largely independent of blood velocity (e.g., see FIGS. 5A-5B). Thus, a QISS data acquisition scan can become less sensitive to cardiac phase—and it may become less necessary to scan during the period of fastest arterial blood flow. By relaxing dependence on cardiac timing, it may even be possible to execute a QISS data acquisition scan ungated, thus further saving scan time and lessening set-up complication.

A QISS sequence was implemented on a research 3T scanner. The arterial trifurcation area was examined on a healthy volunteer using (a) a conventional uniformly shaped rectangular-profile pre-saturation pulse, and then (b) a non-uniform ramp-shaped pulse. In this case, the ramp-shaped pulse had a minimum flip angle of 45° on the in-flow edge and a maximum flip angle of 135° on the out-flow edge.

The following parameters were used: single shot SSFP, TE/TR=2.3/4.6 ms, readout BW=651 Hz/pixel, FOV=18×30 cm, matrix=160×256, partial Fourier matrix factor=0.625, slice thickness/gap=4.0/−1.5 (net=2.5), flip angle=60°, 40 slices, FatSat, QI=230 ms, walking pre-saturation (for venous suppression), PPG gating (delay=450 ms based on empirical measurement). In both cases, the average flip angle across the saturation profile was 90°.

Figure 8B:
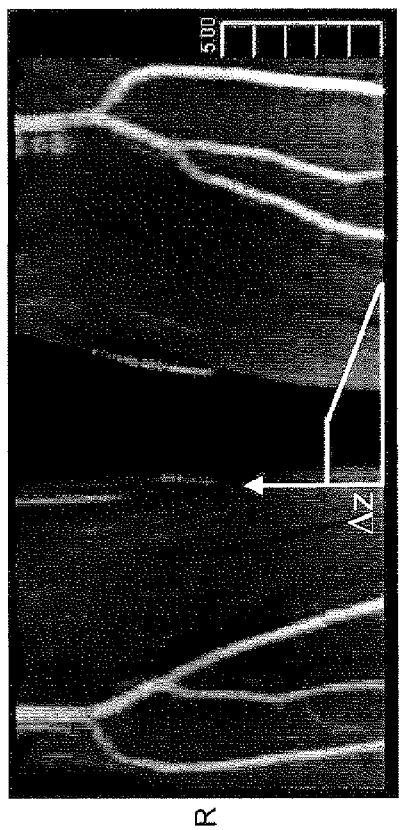
FIGS. 8A-8B depict and compare actual images using (a) a conventional rectangular uniform saturation profile and (b) a ramp-shaped non-uniform saturation profile (for relatively fast-moving blood flows).
Figure 8A:
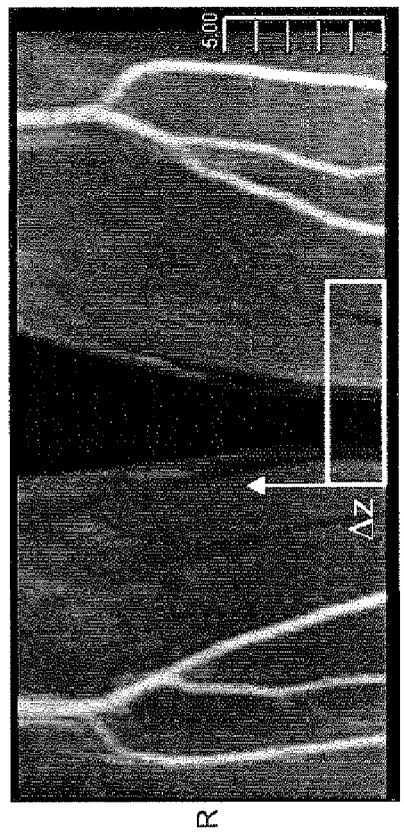

There was limited difference between QISS results with uniform rectangular vs. non-uniform ramp-shaped pre-saturation as shown by comparing FIGS. 8A and 8B. This result is mostly due to the generally fast systolic flow in the trifurcation area (>10 cm/s). Also, the slope of the ramp was mild (45° to 135°). There is slightly greater background suppression in the ramp shaped data, although this could be caused by small variation in the actual average flip angle. At the prevalent T1 of ~800 ms (muscle), a slightly higher average flip angle might result in slightly improved background suppression.

In any event, these results confirm that the shaped saturation profile produces desired integrated saturation across the selected slice, even though the saturation flip angle across the slice was non-uniform.

FIGS. 8A and 8B compare conventional uniform rectangular saturation profile (left) vs. ramp shaped pre-saturation profile (right) for relatively fast flow arteries (the trifurcation) where major improvement for extremely slow blood flows was not expected. The images are coronal plane MIP's of QISS multi-slice data. An illustration of the saturation profile shape is given on each image (the slice thickness is exaggerated for demonstration purposes). The slice direction is indicated by the arrow.

The mode of operation for exemplary embodiments is simple. The spatial pre-saturation pulse shape, which is typically a conventional uniform rectangular shaped profile, is replaced with a non-uniformly shaped spatial profile pre-saturation pulse. The non-uniform profile shape can be arbitrarily defined, and thus can be designed to maximize MRI signal from in-flowing nuclei based on parameters such as flow velocity, slice thickness and in-flow time (QI). Some suggested non-uniform saturation profiles are diagrammed in FIGS. 4B-4D. The detailed design of such slice pre-saturation profiles can be generated using a number of well-known methods.

The average flip angle of the saturation profile is a free parameter. However, as is known, a flip angle of 90° has an advantage in being robust with respect to gating variations (i.e., R-R interval fluctuations in EKG signal due to arrhythmia).

Various MRA and/or MRV pulse sequences (e.g., the QISS technique) are already established. However, using a non-uniform pre-saturation spatial profile should offer improvement—e.g., such as for a critical aspect of the QISS technique like the pre-saturation RF pulse and its associated in-flow period.

The pre-saturation profile shape may also be adjusted (e.g., reversed) to selectively enhance fast-flowing spins.

The exemplary non-uniformly shaped pre-saturation profile techniques can increase signal from slow-flowing spins (e.g., velocity <10 cm/s). By this same mechanism, the shaped pre-saturation profile better maintains vessel signal for short post-saturation delays (QI) or thick slices. Since the non-uniformly shaped pre-saturation profile makes QISS less sensitive to flow velocity, the QISS application becomes more robust to variations in flow velocity, including arrhythmia.

Although the spatially non-uniform flip angle of the pre-saturation pulse can result in greater specific absorption rate (SAR) (e.g., because SAR is proportional to the square of the flip angle, the SAR of a non-uniform profile will be greater than a uniform rectangular shaped pulse), the SAR contribution of the pre-saturation pulse is only a fraction of the overall SAR of a complete sequence (which is dominated by the RF excitation pulse).

If there is heterogeneous distribution of materials with different T1 (fat/muscle/fluid) within a slice, the non-uniform flip angle profile of the shaped pre-saturation pulse can produce non-uniform saturation. Since the total saturation of the slice is the integral of NMR magnetization across the slice, depending on the delay time (QI), a non-uniform flip angle applied to heterogeneous T1 can possibly produce greater background signal than a uniform flip angle applied to heterogeneous T1. However, since the slices are typically thin (<5 mm) and the adjacent tissue generally homogeneous (fat or muscle), this is a negligible issue, as demonstrated by FIGS. 8A-8B.

The exemplary embodiments use a shaped profile selection pulse as a pre-saturation pulse. Modifying the saturation profile selectively enhances velocity-dependent signal from in-flowing spins.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for using a magnetic resonance imaging (MRI) system to produce an image representative of the vasculature of a subject, said method comprising:
    (a) applying a non-contrast MRI pulse sequence to acquire MRI k-space data from non-stationary nuclei flowing in a selected spatial region of a subject after nuclei within said region have been subjected to spatially non-uniform pre-saturation of nuclear magnetic resonant (NMR) magnetization by a pre-saturation pulse having a non-uniform profile in the spatial domain across the region for the purpose of suppressing subsequent MRI signals emanating from background nuclei located within said region during said pre-saturation; and
    (b) using the acquired MRI k-space data to reconstruct an image representing vasculature of said subject.

2. A method as in claim 1, wherein said spatially non-uniform pre-saturation comprises less saturation at locations where nuclei flow into said region than at locations where nuclei flow out of said region thereby enhancing MRI signals emanating from slow-moving nuclei that were present in said region during said pre-saturation and remain in said region during MRI data acquisition.

3. A method as in claim 1, wherein said spatially non-uniform pre-saturation comprises more saturation at locations where nuclei flow into said region than at locations where nuclei flow out of said region thereby enhancing MRJ signals emanating from moving nuclei that enter said region subsequent to saturation and remain in said region during MRI data acquisition.

4. A method as in claim 1, wherein said spatially non-uniform pre-saturation effects a saturation profile that changes substantially linearly along at least a portion of said region across which said non-stationary nuclei flow.

5. A method as in claim 1, wherein said spatially non-uniform pre-saturation effects a saturation profile that changes substantially non-linearly along at least a portion of said region across which said non-stationary nuclei flow.

6. A method as in claim 1, wherein said spatially non-uniform pre-saturation effects a saturation profile that abruptly changes along at least a portion of said region across which said non-stationary nuclei flow.

7. A method as in claim 1, wherein said spatially non-uniform pre-saturation effects a saturation profile that produces an average saturation of approximately 90 degrees along a path across said region in the direction of said non-stationary nuclei flow.

8. A method as in claim 1, wherein said spatially non-uniform pre-saturation effects a saturation profile which selectively enhances velocity-dependent MRI signal emanating from NMR nuclei in-flowing to said region.

9. A method as in claim 1, wherein said non-contrast MRI pulse sequence comprises a non-contrast enhanced quiescent-interval single-shot (QISS) sequence that has been modified to use a pre-saturation pulse effecting a shaped saturation profile in the spatial domain as a function of spatial position across said region in a expected general direction of flow for said non-stationary nuclei.

10. A non-transitory computer program storage medium containing computer program code which, when executed by at least one computer in an MRI system, effects the method of claim 1.

11. A magnetic resonance imaging (MRI) system including a static magnet, gradient magnets, RF coils and at least one controlling computer configured to produce an image representative of the vasculature of a subject, said system comprising at least one computer programmed to:
    (a) apply a non-contrast MRI pulse sequence to acquire MRI k-space data from non-stationary nuclei flowing in a selected spatial region of a subject after nuclei within said region have been subjected to spatially non-uniform pre-saturation of nuclear magnetic resonant (NMR) magnetization by a pre-saturation pulse having a non-uniform profile in the spatial domain across the region for the purpose of suppressing subsequent MRI signals emanating from background nuclei located within said region during said pre-saturation; and
    (b) use the acquired MRI k-space data to reconstruct an image representing vasculature of said subject.

12. An MRI system as in claim 11, wherein said spatially non-uniform pre-saturation comprises less saturation at locations where nuclei flow into said region than at locations where nuclei flow out of said region thereby enhancing MRI signals emanating from slow-moving nuclei that were present in said region during said pre-saturation and remain in said region during MRI data acquisition.

13. An MRI system as in claim 11, wherein said spatially non-uniform pre-saturation comprises more saturation at locations where nuclei flow into said region than at locations where nuclei flow out of said region thereby enhancing MRI signals emanating from moving nuclei that enter and remain in said region during MRI data acquisition.

14. An MRI system as in claim 11, wherein said spatially non-uniform pre-saturation effects a saturation profile that changes substantially linearly along at least a portion of said region across which said non-stationary nuclei flow.

15. An MRI system as in claim 11, wherein said spatially non-uniform pre-saturation effects a saturation profile that changes substantially non-linearly along at least a portion of said region across which said non-stationary nuclei flow.

16. An MRI system as in claim 11, wherein said spatially non-uniform pre-saturation effects a saturation profile that abruptly changes along at least a portion of said region across which said non-stationary nuclei flow.

17. An MRI system as in claim 11, wherein said spatially non-uniform pre-saturation effects a saturation profile that produces an average saturation of approximately 90 degrees along a path across said region in the direction of said non-stationary nuclei flow.

18. An MRI system as in claim 11, wherein said spatially non-uniform pre-saturation effects a saturation profile which selectively enhances velocity-dependent MRI signal emanating from NMR nuclei in-flowing to said region.

19. An MRI system as in claim 11, wherein said non-contrast MRI pulse sequence comprises a non-contrast enhanced quiescent-interval single-shot (QISS) sequence that has been modified to use a pre-saturation pulse effecting a shaped saturation profile in the spatial domain as a function of spatial position across said region in a expected general direction of flow for said non-stationary nuclei.

* * * * *